(12) United States Patent
Esposito et al.

(10) Patent No.: US 7,613,760 B1
(45) Date of Patent: Nov. 3, 2009

(54) EFFICIENT IMPLEMENTATION OF MULTI-CHANNEL INTEGRATORS AND DIFFERENTIATORS IN A PROGRAMMABLE DEVICE

(75) Inventors: Benjamin J. Esposito, Ovideo, FL (US); David J. Moore, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 904 days.

(21) Appl. No.: 10/804,294

(22) Filed: Mar. 18, 2004

(51) Int. Cl.
*G06F 17/17* (2006.01)

(52) U.S. Cl. .......................................... 708/313; 708/6

(58) Field of Classification Search ................... 708/313
See application file for complete search history.

(56) References Cited

U.S. PATENT DOCUMENTS

| | | | | |
|---|---|---|---|---|
| 4,686,655 | A * | 8/1987 | Hyatt | 367/59 |
| 4,999,798 | A * | 3/1991 | McCaslin et al. | 708/313 |
| 5,117,349 | A | 5/1992 | Tirfing et al. | 707/3 |
| 5,546,477 | A | 8/1996 | Knowles et al. | 382/242 |
| 6,401,230 | B1 | 6/2002 | Ahanessians et al. | |
| 6,570,842 | B1 | 5/2003 | Landolsi | 370/210 |
| 6,600,788 | B1 | 7/2003 | Dick et al. | |
| 6,829,629 | B1 * | 12/2004 | Magesacher et al. | 708/313 |
| 6,970,511 | B1 * | 11/2005 | Barnette | 375/240.21 |
| 7,110,927 | B1 | 9/2006 | San et al. | |

OTHER PUBLICATIONS

San et al., "Finite Impulse Response (Fir) Filter Compiler," U.S. Appl. No. 09/773,853, filed Jan. 31, 2001.

D'souza et al., "Dynamically Re-Configurable Signal Decimation System Using A Finite Impulse Response (Fir) Filter," U.S. Appl. No. 10/396,194, filed Mar. 24, 2003.

Shung et al., "An integrated CAD system for Algorithm-Specific IC Design", IEEE Transactions on Computer-Aided Design, vol. 10, No. 4, Apr. 1991.

Saramaki et al., "Digital Filtering in FPGAs", 1994 Conference Record of the Twenty-eigth Asilomar Conference on Signals, Systems, and Computers, vol. 2, pp. 1373-1377, 1994.

Jain et al., "FIRGEN: A computer-aided design System for High Performance FIR Filter Integrated Circuits", IEEE Transactions on Signal Processing, vol. 39, No. 7, Jul. 1991.

(Continued)

*Primary Examiner*—Lewis A Bullock, Jr.
*Assistant Examiner*—Michael Yaary
(74) *Attorney, Agent, or Firm*—Weaver Austin Villeneuve & Sampson LLP

(57) ABSTRACT

Efficiently implemented multi-channel integrators and multi-channel differentiators utilize a delay section in a single integrator or differentiator in lieu of parallel integrator or differentiator lines to handle multi-channel data flow and processing. The delay section functions like a shift register, greatly reducing the space and/or resources required for implementing the integrator or differentiator. Such integrators and differentiators can be used in multi-channel decimators, interpolators and numerically controlled oscillators in place of multiple instances of single channel integrators that have had to be used in earlier systems. These structures and devices can be implemented in programmable devices such as PLDs and similar devices, in which the delay section can be implemented in embedded memory in the device. Multi-stage decimators and interpolators can use multiple instances of an integrator and/or differentiator in series.

30 Claims, 9 Drawing Sheets

OTHER PUBLICATIONS

San et al., "Finite Impulse Response (Fir) Filter Compiler," U.S. Appl. No. 09/773,853, filed Jan. 31, 2001, Office Action Mailed Jul. 15, 2004.

San et al., "Finite Impulse Response (Fir) Filter Compiler," U.S. Appl. No. 09/773,853, filed Jan. 31, 2001, Final Office Action Mailed Dec. 17, 2004.

USPTO Office Action mailed Jul. 12, 2005 in related U.S. Appl. No. 09/773,853 (17 Pages).

USPTO Office Action mailed Jan. 4, 2006 in related U.S. Appl. No. 09/773,853 (12 Pages).

USPTO Notice of Allowance and Fee(s) Due mailed May 18, 2006 in related U.S. Appl. No. 09/773,853 (10 Pages).

"The Altera Advantage News and Views" May 1997. pp. 1-31.

"Altera News & Views" First Quarter Feb. 2000 p. 1-44.

Baicher et al., "Learning About Digital Signal Processing Using Spreadsheets and Simulation Software" 1996 pp. 41-48.

Bishop, R-H., "Modern Control Systems Analysis and Design Using MATLAB & SIMULINK" 1997. pp. 95-101, 192-207, 211-214.

Eminoglu et al., "A CAD environment for digital filters using a VerilogHDL based functional bit-serial compiler" 1998. $10^{th}$ International Conference Monastir Tunisia (abstract). pp. 1-2.

"FIR Compiler MegaCore" version 2.6.0. 1995-2003 p. 1-5.

"FIR Compiler MegaCore Function" Solution Brief 41, Jun. 1999, ver. 1 pp. 1-4.

Hussein et al., "Design and Verification Techniques Used in a Graduate Level VHDL Course", IEEE Frontiers in Education Conference Nov. 10-13, 1999 p. 28-31.

Mathworks Inc., "Student Edition of MATLAB" 1997, pp. 38,39,256,257,335-345.

Mintzer, Les, "Digital Filtering in FPGA's", 1994 Conference Record of the Twenty-Eighth Asilomar Conference on Signals, Systems and Computers. vol. 2, pp. 1373-1377.

* cited by examiner

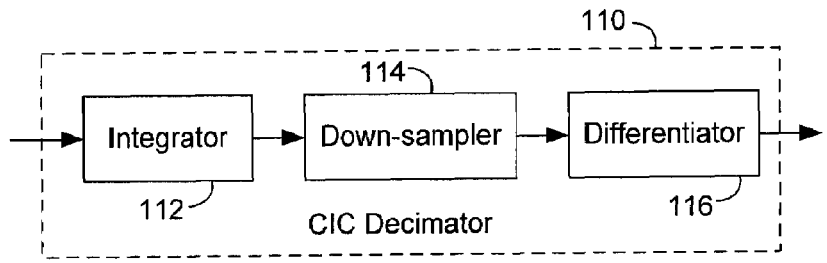
*Figure 1A (Prior Art)*
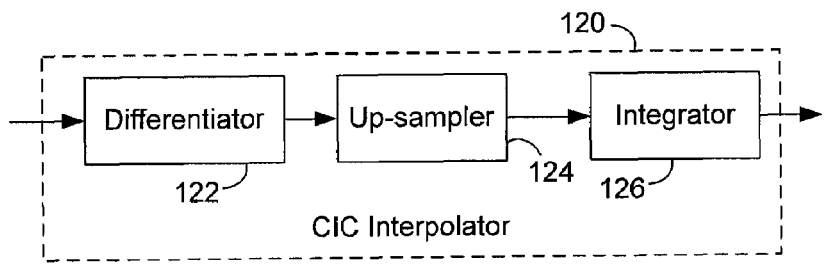
*Figure 1B (Prior Art)*
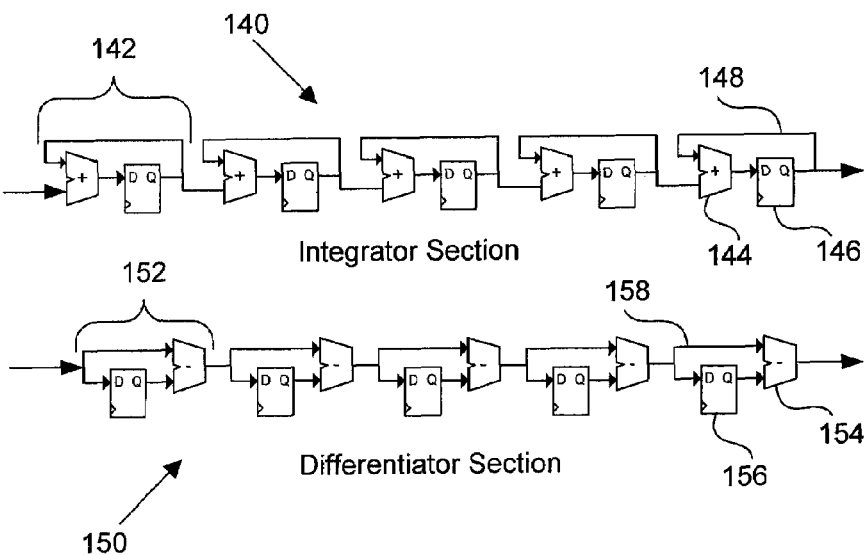
*Figure 1C (Prior Art)*
*Figure 1D (Prior Art)*

EFFICIENT IMPLEMENTATION OF MULTI-CHANNEL INTEGRATORS AND DIFFERENTIATORS IN A PROGRAMMABLE DEVICE

BACKGROUND OF THE INVENTION

1. Field of the Invention

This invention relates generally to digital signal processing and, more specifically, to the efficient use of memory and/or logic resources in implementing functions such as multi-channel integrators and multi-channel differentiators used in multi-channel decimators, multi-channel interpolators, multi-channel numerically controlled oscillators (NCOs) and similar structures and/or functions in programmable or otherwise configurable devices, including programmable logic devices.

2. Description of Related Art

A programmable logic device ("PLD") is a programmable integrated circuit (IC) that allows the user of the circuit, using software control, to program the PLD to perform particular logic functions. A wide variety of these devices are manufactured by Altera Corporation of San Jose, Calif. For the purpose of this description, it is to be understood that a programmable logic device refers to once programmable as well as re-programmable devices. When an integrated circuit manufacturer supplies a typical programmable logic device, it is not been capable of performing any specific function until after it has been configured by a user.

Therefore, a user, in conjunction with software supplied by the manufacturer or created by the user or an affiliated source, programs the PLD to perform a particular function or a plurality of functions required by the user's application. Configuration data, such as a bitstream, can be sent to the PLD to program and/or configure the PLD to perform one or more desired functions. This programming of a PLD uses various device resources, including logic elements (LEs), that are found on a given programmable device.

Many digital signal processing devices use multi-channel integrators and/or differentiators. For example, such structures may be used in decimation units to condition data. Decimation (or down-sampling) of a signal reduces the number of data points in the original data signal, typically to permit use of the data at a lower data rate. Decimation is used in a variety of digital signal processing devices in a wide range of applications (for example, medical imaging).

Multi-channel cascaded integrator-comb (CIC) filters are used frequently in digital modulation and demodulation circuits. Often, such uses involve interpolation and/or decimation, in which the data signal is digitally up-sampled or down-sampled, respectively. Proper conditioning of a signal as part of a data rate change is critical to proper digital signal processing. Moreover, multi-channel integrators and differentiators may be used in wireless systems that need to handle multiple channels of voice and/or data.

Basic single channel CIC filters are shown in FIGS. 1A and 1B. As seen in the Figures, CIC filters can be used for both decimation and interpolation. In a CIC filter used for decimation, as seen in FIG. 1A, the unit 110 includes an integrator unit 112, followed by a down-sampler 114, followed by a differentiator unit 116. Similarly, a CIC filter used for interpolation has a unit 120 using a differentiator unit 122, an up-sampler 124 and an integrator unit 126. The up-sampler and down-sampler blocks are simple to implement in a programmable device, such as a PLD, as will be appreciated by those skilled in the art. Moreover, these blocks do not utilize substantial programmable device resources.

A standard prior art single channel, 5 stage integrator unit 140 is shown in FIG. 1C. Integrator section 140 consists of five integrators 142 that each have an adder 144 and a delay element 146 using a feedback line 148, configured in a manner known to those skilled in the art. A standard prior art single channel, 5 stage differentiator section 150 is shown in FIG. 1D. Differentiator unit 150 consists of five differentiators 152, each having a subtractor 154 and a delay element 156 using a feedforward line 158, again configured in a manner known to those skilled in the art. CIC filters typically require such multiple stages and thus take up significant device resources when multiple channels are supported. Typical wireless applications, for example, may need as many as five stages to support the filter requirements of such systems.

FIG. 2 shows circuitry for a unit such as the one shown in FIG. 1A using prior art techniques for implementing a 5 stage, 8 channel CIC filter for decimation in a programmable device. As seen in FIG. 2, circuit 200 has 8 input lines 210a, 210b, 210c, 210d, 210e, 210f, 210g and 210h, each of which handles one channel's data. Line 210a inputs data to an integrator unit 220 consisting of five individual integrators 222. Each integrator 222 is made up of an adder 224, an associated delay element 226 and a feedback line 228 in a standard configuration. The output of one line's integrator unit 220 is input into that channel's own down-sampler 230, where the data rate is reduced. The output of each channel's down-sampler 230 is then input into a differentiator unit 240 consisting of five individual differentiators 242. Each differentiator 242 is made up of a subtractor 244, an associated delay element 246 and a feedforward line 248 in a standard configuration.

Each stage may contain data busses greater than 64 bits to handle the dynamic range of the filter. If, for example, 8 channels are needed for decimation and the data bus is 64 bits, then the required resources (in terms of logic elements) for the integrator and differentiator sections of the circuit of FIG. 2 are:

$$((64*5)\text{int}+(64*5*2)\text{diff})*8=7680\text{LEs}$$

In a situation where 16 channels are needed with each supporting data widths of 50 bits, with a 5 stage CIC, then the following LE resources are needed:

Integrator—50*16*5=4000 LEs

Differentiator—50*16*5*2=8000 LEs

Total—12000 LEs

As seen in Table 1, the number of required LEs for standard 5 stage CIC filtering schemes increases proportionally with the implementation of additional channels. The following table shows results for 64 bit data and 5 stage CIC filters:

TABLE 1

| Number of channels | LEs required using current CIC implementation |
| --- | --- |
| 8 | 7680 |
| 16 | 15360 |
| 24 | 23040 |
| 32 | 30720 |
| 64 | 61440 |
| 128 | 122880 |

NCOs also use structures that are essentially identical to the integrators of CIC type filters and devices. An NCO generates sinusoidal signals of a desired frequency for various functions and purposes in programmable devices. A standard, single channel NCO 300 is shown in FIG. 3A. A phase incrementation value is input at the NCO input 302 and is used in a phase accumulator 304, which is basically a single stage integrator. The phase accumulator rotates the angular position of a phasor about the unit circle at a rate defined by the input phase increment. A polar-to-cartesian transformation of the phase value that is output from the phase accumulator is performed by a sine and cosine generation unit 306 to yield the output sinusoidal values.

As seen in FIG. 3B, a prior multi-channel NCO 300 implemented on a digital device 301 (for example, a PLD) generates sine and cosine values for multiple channels in a device. An N channel system has N NCOs 303$a$, 303$b$, ..., 303N using inputs 302$a$, 302$b$, ..., 302N to generate N pairs of sine and cosine values, one pair corresponding to each frequency generated by a channel's phase accumulator 304. As with integrators and differentiators used for CIC filtering, current implementations of multi-channel NCOs in programmable devices and the like require substantial device resources in terms of LE usage.

Systems, methods and techniques that permit implementation of various multi-channel integrators and multi-channel differentiators for use in CIC filters, NCOs and the like that can support multiple channels of data, while efficiently using area, speed and other resources in a PLD or other digital signal processing device would represent a significant advancement in the art. Moreover, generating a flexible, standard structure to implement a variety of CIC filters, NCOs and the like whose rates can be adjusted easily would likewise constitute a significant advancement in the art.

BRIEF SUMMARY OF THE INVENTION

Embodiments of the present invention are efficiently implemented multi-channel integrators and multi-channel differentiators and devices and structures that use the same. These structures and devices can be implemented in programmable devices such as PLDs and similar devices. Moreover, the present invention includes computer program products that can program such programmable devices to implement such structures.

More specifically, a multi-channel integrator according to at least one of the embodiments of the present invention uses a delay section that functions like a shift register to handle multiple channels of data without the need for parallel channel structures. The delay section has multiple delay elements connected in series between the delay section input and output. The output of the delay section is fed back to one input of an adder that has the integrator input as the adder's second input. The output of the adder is the input of the delay section.

A single multi-channel integrator according to one or more embodiments of the present invention can be used in multi-channel decimators, interpolators and numerically controlled oscillators in place of multiple instances of single channel integrators that have had to be used in earlier systems. When a multi-channel integrator of the present invention is implemented in a programmable device, such as a PLD, the delay section may be implemented in embedded memory in the device.

Analogously, a multi-channel differentiator according to at least one of the embodiments of the present invention also uses a delay section that functions like a shift register to handle multiple channels of data without the need for parallel channel structures. The delay section again has multiple delay elements connected in series between the delay section input and output. The differentiator input is fed forward as one input to a subtractor, while the output of the delay section is a second input to the subtractor. The output of the subtractor is the differentiator output.

A single multi-channel differentiator according to one or more embodiments of the present invention can be used in multi-channel decimators and interpolators in place of multiple instances of single channel differentiators that have had to be used in earlier systems. When a multi-channel differentiator of the present invention is implemented in a programmable device, such as a PLD, the delay section may be implemented in embedded memory in the device.

Decimators and interpolators using integrators and/or differentiators of the present invention can have multiple stages. In such structures, multiple instances of an integrator and/or differentiator can be used in series.

Computer program products according to one or more embodiments of the present invention include computer code for programming a device to create a programmed device that implements an integrator and/or a differentiator according to the present invention. The programmed device may be a PLD, ASIC or other suitable device.

Further details and advantages of the invention are provided in the following Detailed Description and the associated Figures.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which:

FIG. 1A is a block diagram of a decimation unit in which the present invention can be implemented.

FIG. 1B is a block diagram of an interpolation unit in which the present invention can be implemented.

FIG. 1C is an integrator section usable in the decimation and interpolation units of FIGS. 1A and 1B.

FIG. 1D is a differentiator section usable in the decimation and interpolation units of FIGS. 1A and 1B.

DETAILED DESCRIPTION OF THE INVENTION

The following detailed description of the invention will refer to one or more embodiments of the invention, but is not limited to such embodiments. The detailed description is intended only to be illustrative. Those skilled in the art will readily appreciate that the detailed description given herein with respect to the Figures is provided for explanatory purposes as the invention extends beyond these limited embodiments.

The improved multi-channel integrators and differentiators of the present invention are based on the use of a delay section acting as a shift register to hold and then latch or clock through sequential, intermediate results for each channel being processed. The delay section may be implemented in a programmable device by using embedded memory blocks to implement a delay section within a multi-channel integrator as well as a multi-channel differentiator. This improved architecture requires only one instance of the integrator or differentiator, one delay section (for example, an embedded memory in a programmable device) and an input multiplexer to multiplex the multiple channels onto a common bus.

One or more computer program products comprising a machine readable medium on which is provided program instructions for producing circuitry using one or more such delay sections also are disclosed. Such computer program products may be used to program hardware such as programmable devices like PLDs. Moreover, methods are disclosed for implementing multi-channel devices using such delay sections.

Embodiments of the present invention thus permit simple implementation(s) of multi-channel integrators and/or multi-channel differentiators usable in various applications, including (but not limited to) multi-channel interpolator and decimator applications and multi-channel NCO applications. Rather than implementing parallel lines of identical integrators and/or differentiators, as in prior systems and structures, a single line can be used employing a shift register (also referred to herein as a delay section) and supplying input data to the single line using a multiplexed input data stream on a common bus.

Figure 4A:
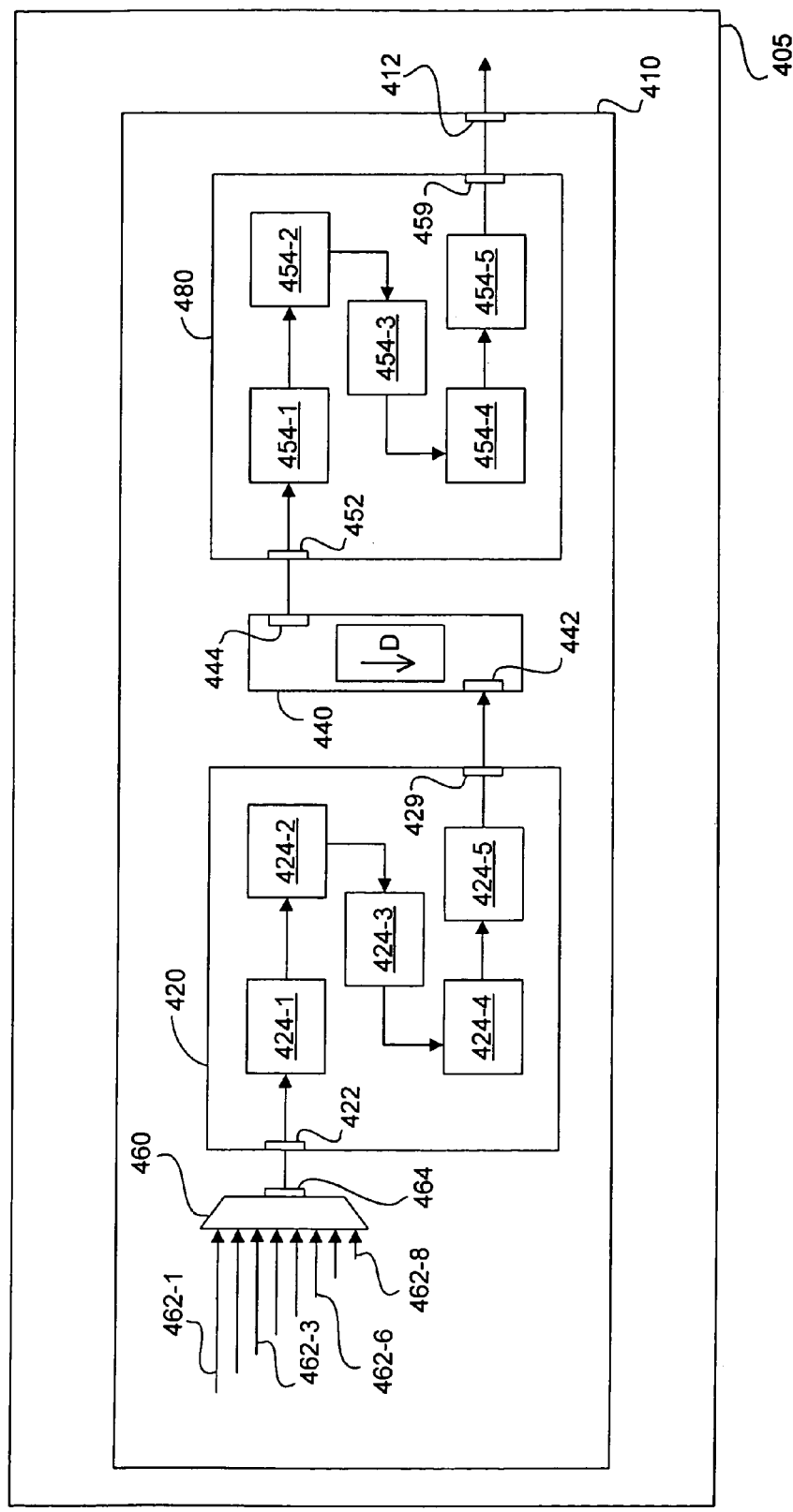
FIG. 4A is a block diagram of a multi-channel down conversion unit using one embodiment of the present invention implemented on or is otherwise part of a digital device, such as a PLD or other logic device.

A block diagram of one embodiment of the present invention is shown in FIG. 4A. In FIG. 4A, a multi-channel decimator 410 using one embodiment of the present invention is implemented in (or is otherwise part of) a digital device 405 (for example, a PLD or other logic device). For purposes of illustration, the unit 410 shown in FIG. 4A is an 8 channel filter, though the number of channels with which the present invention may be used is not limited to 8 or any other number. (Moreover, with simple modifications, per FIG. 1B, the components of FIG. 4A can be used in an interpolator as well.) Decimator 410 includes a 5 stage integrator section 420, a down-sampler 440 and a 5 stage differentiator section 480. Again, the use of a 5 stage filter system is for illustration purposes only; the invention is not limited to any particular number of stages.

Figure 2:
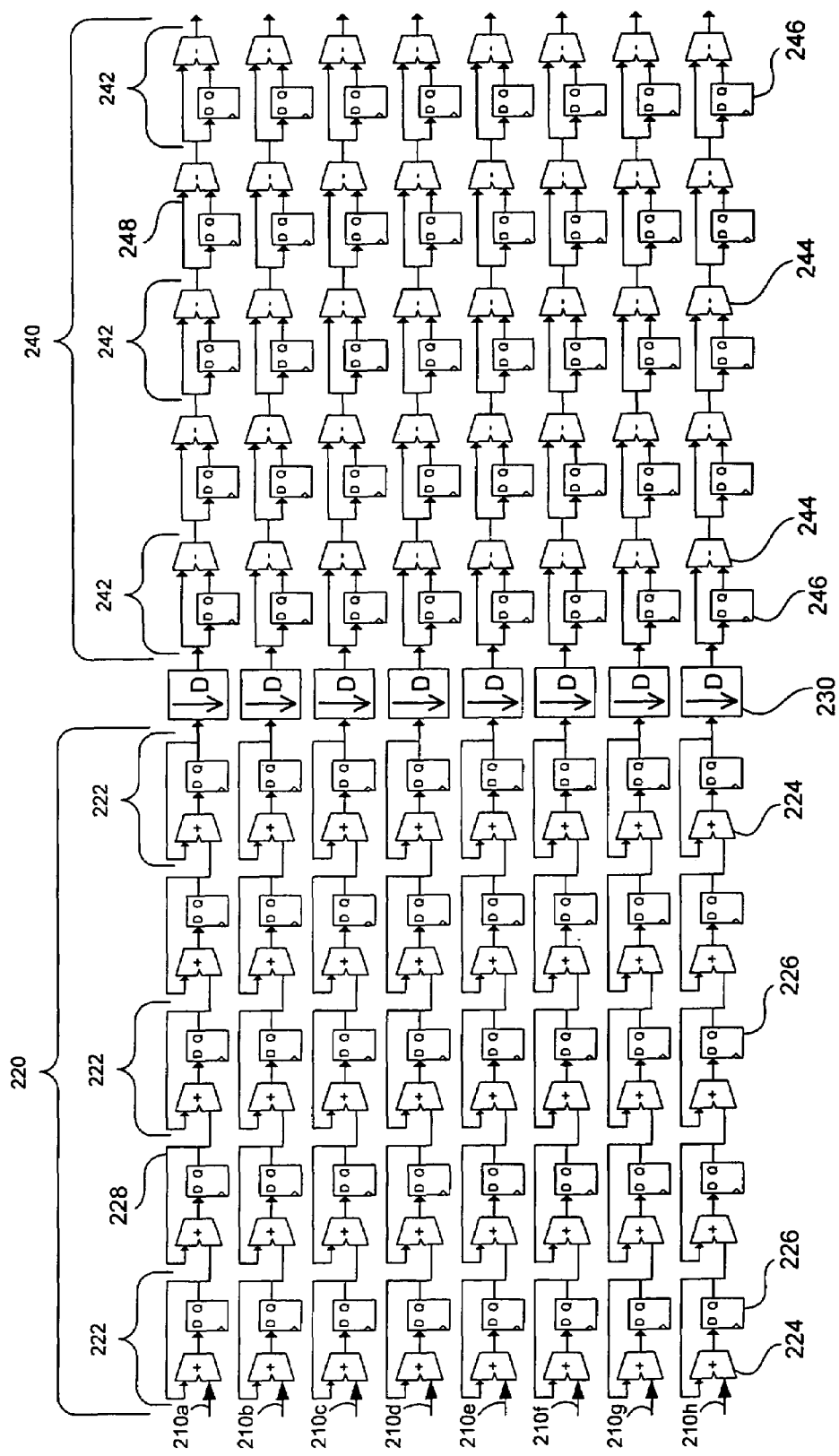
FIG. 2 is a diagram of a prior art structure for implementing a 5 stage, 8 channel CIC filter for decimation in a programmable or other digital device.

As seen in FIG. 4A, input data is fed input to multiplexer 460 on lines 462-1 through 462-8. As seen in FIG. 4A, data from the output 464 of multiplexer 460 is sequentially input into the integrator unit 420 at integrator section input 422 using, for example, a single line for transmitting the data for all 8 channels (in contrast to the 8 lines needed in earlier systems, such as the system shown in FIG. 2). In FIG. 4A, integrator section 420 is comprised of 5 identical, multi-channel integrators 424-1, 424-2, 424-3, 424-4, 424-5 according to one embodiment of the present invention. These five integrators are connected in series (sequentially), so that the output of integrator 424-1 is the input of integrator 424-2 and so forth.

The output 429 of integrator unit 420 is connected to the input 442 of down-sampler 440, which down-samples the data in a manner well known to those skilled in the art. While down-sampling itself is well known, the present invention permits down-sampling using a single down-sampler for all data on the 8 channels of the present example, as opposed to the 8 separate down-samplers 230 of the earlier system shown in FIG. 2.

The down-sampled data is sent from the output 444 of down-sampler 440 to the input 452 of differentiator section 480, again, for example, using a single line for all data for the 8 channels. Differentiator unit 480 is comprised of 5 identical, multi-channel differentiators 454-1, 454-2, 454-3, 454-4, 454-5 according to one embodiment of the present invention. These five differentiators are connected in series (sequentially), so that the output of differentiator 454-1 is the input of differentiator 454-2 and so forth. The data then is provided at output 459 of differentiator section 480, which, in the embodiment of the present invention shown in FIG. 4A, also can be the output 412 of unit 410. In such a system, a commutator or other suitable device or structure can cyclically deliver sequential decimated data on a common line (such as the output 412 of decimator 410, for example) to separate channel lines in the system, if desired.

Figure 4B:
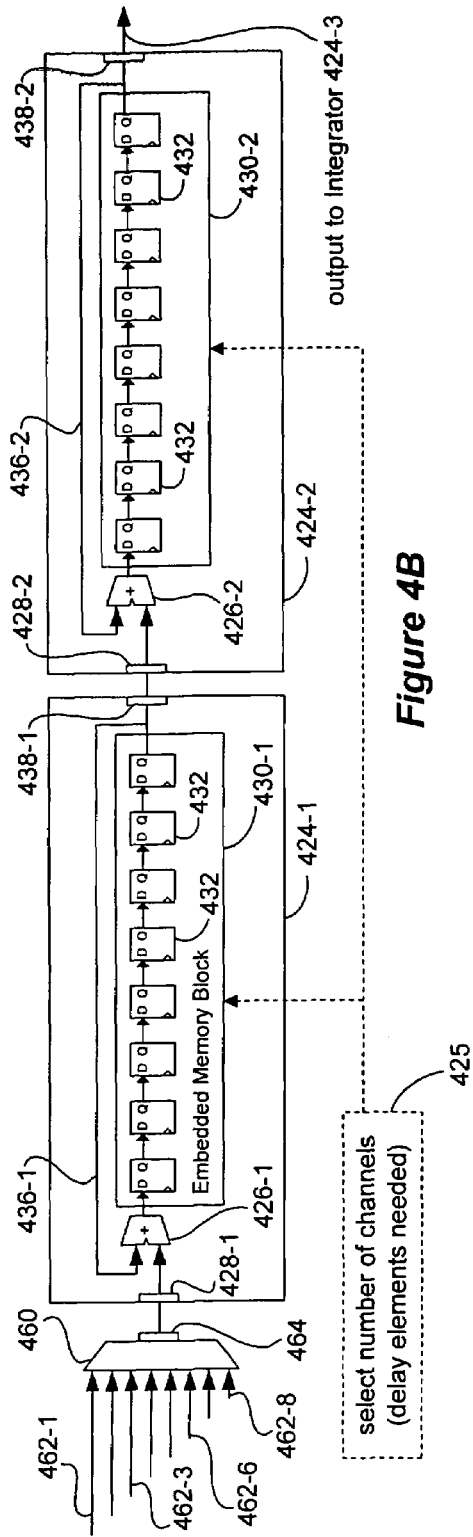
FIG. 4B is a diagram of the multiplexer and first two integrators of the multi-channel down conversion unit of FIG. 4A, using delay sections according to one embodiment of the present invention.
Figure 4C:
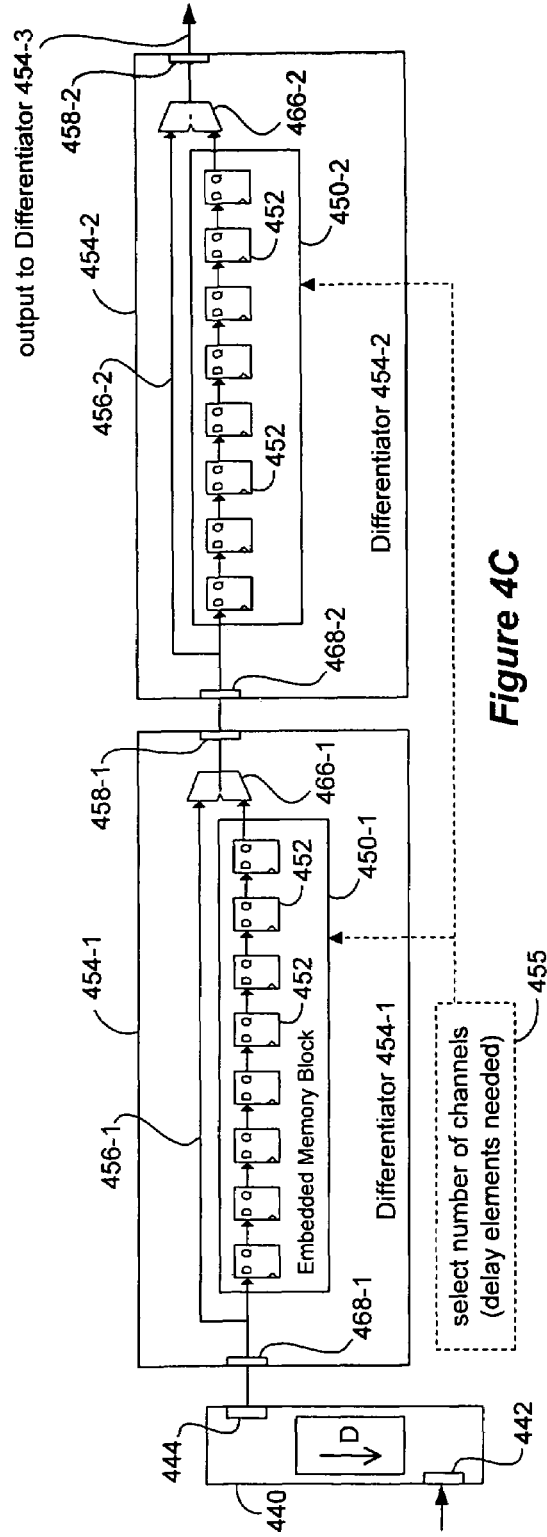
FIG. 4C is a diagram of the decimator and first two differentiators of the multi-channel down conversion unit of FIG. 4A, using delay sections according to one embodiment of the present invention.

FIGS. 4B and 4C show embodiments of the present invention that can be used in unit 410 of FIG. 4A (and in other multi-channel devices). Multi-channel integrators 424-1 and 424-2 of the integrator section 420 of FIG. 4A are shown in more detail in FIG. 4B, according to one embodiment of the present invention. Multi-channel data from the multiplexer 460 is provided to the input 428-1 of the first integrator 424-1, which is also the first input of an adder 426-1. The other input of adder 426-1 is the value provided by feedback line 436-1 from the output of the delay section 430-1. The output of adder 426-1 is passed to the input of the delay section 430-1.

Delay section 430-1 has at least 8 delay elements 432 and thus functions as a shift register. In one embodiment of the present invention, each delay section has the same number of delay elements as channels being input to the multiplexer 460. As will be apparent to those skilled in the art, however, a delay section can possess more delay elements than are necessary for a given application of the invention, so long as the number of delay elements used for a given application is parameterizable or otherwise selectable to achieve the desired behavior of the delay section as a whole. A selection control 425 can be used in parameterizable systems to select the number of channels and thus use and/or implement the appropriate number of delay elements 432 in each integrator 424.

The second integrator 424-2 is identical to integrator 424-1 in structure and performance in this embodiment of the present invention. In this particular example, the second integrator 424-2 uses the same type of adder 426-2 and feedback line 436-2, and has a delay section 430-2 having the same number of delay elements 432 as the first integrator 424-1.

The delay elements 432 in the delay sections 430 delay each channel's data by a time period sufficient to process each channel's data separately and in sequence in integrator unit 420. That is, the first data point $x_{1,1}$ on the first channel (for example, input on line 462-1 of multiplexer 460) is added to the second data point $x_{1,2}$, as a result of the staggering created by the 8 delay elements 432 in section 430-1 of the illustrated example in FIG. 4B. The output of each delay section 430 is therefore data specific to each input channel. Moreover, the sequential data provided by the output 438-1 of integrator 424-1 is fed to the input 428-2 of integrator 424-2 in sequence so that the data at output 438-2 of integrator 424-2 likewise is data that is channel-specific. This organization of the channel data is maintained between integrators 424 and as the integrator unit 420 outputs the data to the input 442 of down-sampler 440.

As seen in FIG. 4C, down-sampled data from the output 444 of down-sampler 440 is input to the first differentiator 454-1 at input 468-1. Data is provided to one input of a subtractor 466-1 and also to the input of another delay section 450-1. Like the delay sections 430 in the integrator unit 420, each delay section 450 of the differentiator section 480 has at least as many delay elements 452 as channels being input to multiplexer 460. Again, in one embodiment of the present invention, the number of delay elements in each delay section 450 is equal to the number of channels. As will be apparent to those skilled in the art, a differentiator delay section 450 can possess more delay elements than are necessary for a given application of the invention, so long as the number of delay elements used for a given application is parameterizable or otherwise selectable to achieve the desired behavior of each delay section 450 as a whole. Again, a selection control 455 (which may, in some embodiments, be the same control 425 used in connection with the integrators 424) can be used in parameterizable systems to select the number of channels and thus use and/or implement the appropriate number of delay elements 452 in each differentiator 454. As with the integrator section 420, the delay configuration of the comb section 480 is designed to process data points from each channel and sequentially output the results.

Embodiments of the present invention can be implemented in a PLD or other programmable device using embedded memory blocks to implement a multi-channel integrator as well as a multi-channel differentiator, as shown for purposes of illustration in FIGS. 4B and 4C. The logic requirements for 8 channels with data widths of 64 bits using the multi-channel integrator and comb techniques of the present invention are:

(64*5)int+(64*5)comb=640LEs plus additional memory blocks

This is significantly smaller than the 7680 LEs required using the prior art technique. Embedded memory blocks are needed, but, for example, only 20 M4K blocks in an Altera Stratix device are needed to support all 8 channels. Moreover, these same 20 blocks will support multi-channel configurations up to 128 channels. A comparison between current structures and techniques and examples of the structures and techniques of the present invention is shown in Table 2:

TABLE 2

| Number of channels | LEs required using prior art CIC | LEs used in present invention | Blocks used in present invention |
| --- | --- | --- | --- |
| 8 | 7680 | 640 | 20 |
| 16 | 15360 | 640 | 20 |
| 24 | 23040 | 640 | 20 |
| 32 | 30720 | 640 | 20 |
| 64 | 61440 | 640 | 20 |
| 128 | 128880 | 640 | 20 |

Figure 3A:
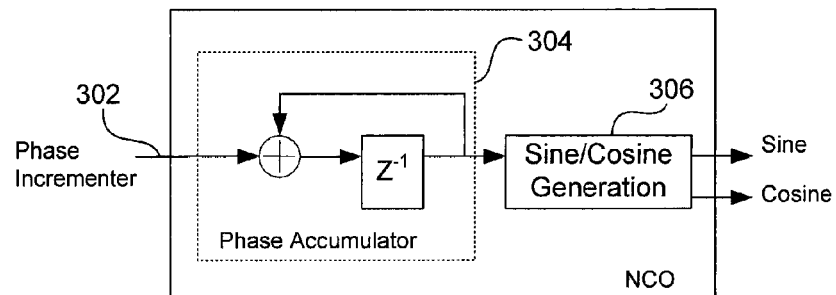
FIG. 3A is a block diagram of a single channel NCO.
Figure 5:
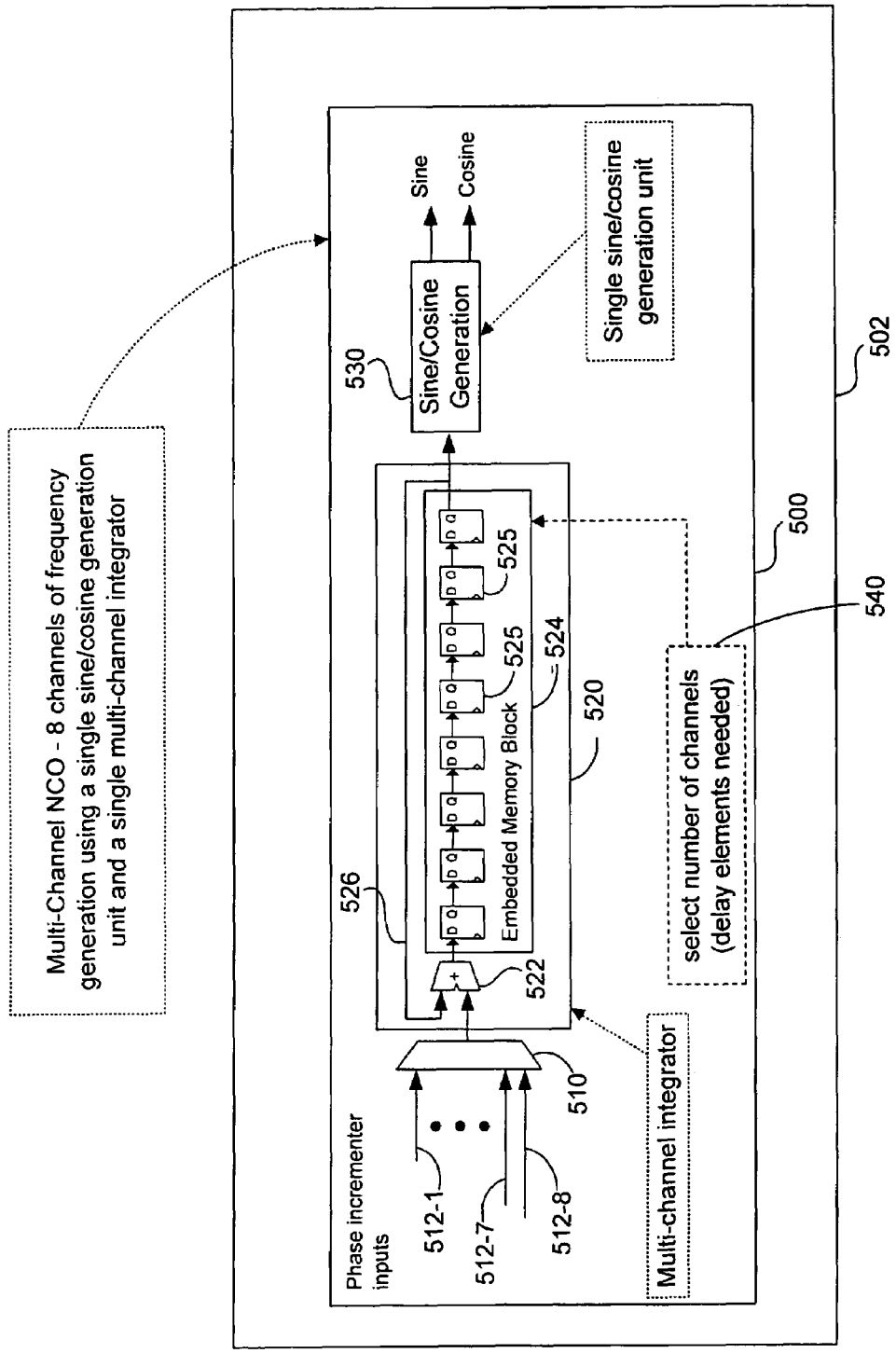
FIG. 5 is a diagram of a multi-channel NCO according to one embodiment of the present invention.

A multi-channel NCO according to one embodiment of the present invention is shown in FIG. 5, showing a single NCO 500 that permits 8 channels of frequency generation using a single, multi-channel integrator and a single sine/cosine generation unit. Like the multi-channel CIC decimation and interpolation structures, the multi-channel NCO 500 shown in FIG. 5 retains much of the simplicity of the single channel NCO of FIG. 3A. The NCO 500 illustrated in FIG. 5 is implemented in a hardware device 502, such as a PLD.

NCO 500 of FIG. 5 generates sinusoidal signals of desired frequency/frequencies for 8 channels (again,). Multi-channel data from the multiplexer 510 (having input data lines 512-1 through 512-8) is provided to the input of the integrator 520. The output of integrator 520 is sent to sine/cosine generator 530, which generates sine and cosine values as the outputs of NCO 500.

To accomplish multi-channel operation, NCO 500 uses a multi-channel integrator 520. The output of multiplexer 510 is one input of an adder 522 in integrator unit 520. The other input of adder 522 is the value provided by feedback line 526 from the output of the delay section 524. The output of adder 522 is passed to the input of the delay section 524. As with the multi-channel integrators discussed above, delay section 524 has at least 8 delay elements 525 in this embodiment, and thus functions as a shift register. In one embodiment of the present invention, delay section 524 has exactly the same number of delay elements as channels being input to the multiplexer 510. As will be apparent to those skilled in the art, however, a delay section can possess more delay elements than are necessary for a given application of the invention, so long as the number of delay elements used for a given application is parameterizable or otherwise selectable to achieve the desired behavior of the delay section as a whole. A selection control 540 can be used in parameterizable systems to select the number of channels and thus use and/or implement the appropriate number of delay elements 525 in the integrator 520.

Figure 3B:
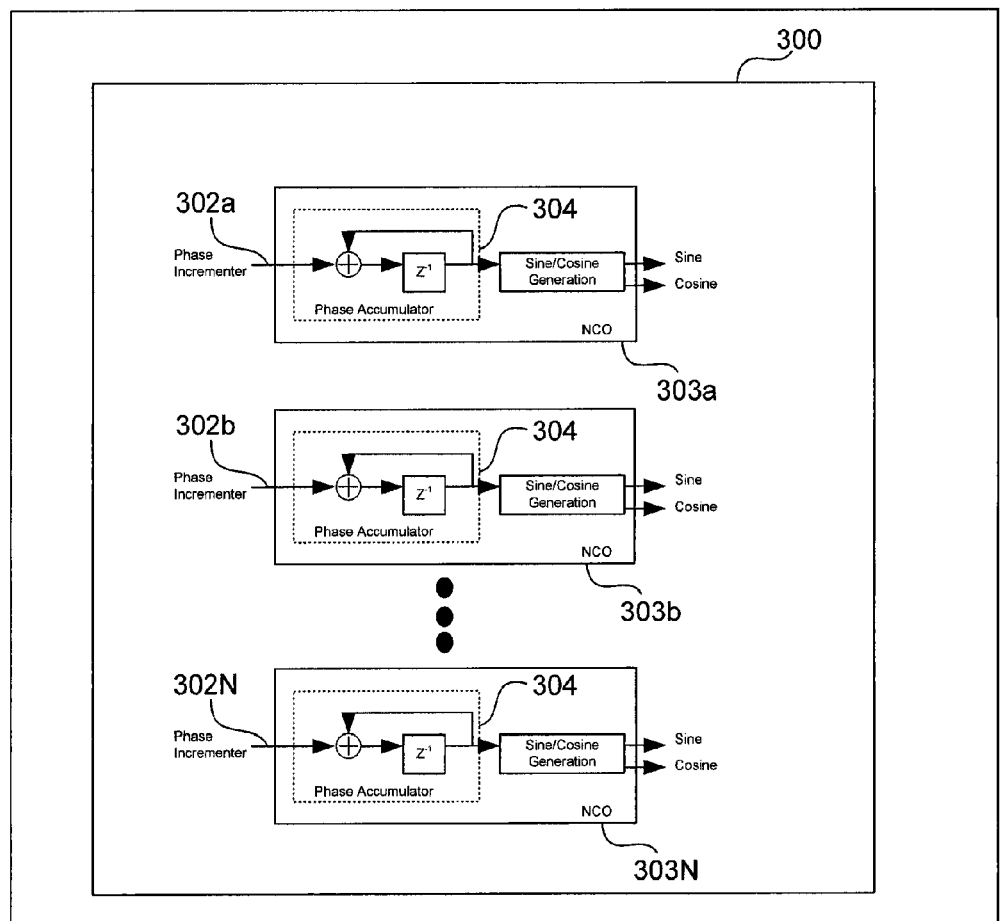
FIG. 3B is a diagram of a prior art structure for implementing an N channel NCO in a programmable or other digital device.

As with the multi-channel interpolators and decimators of the present invention, discussed above, a multi-channel NCO according to one or more embodiments of the present invention also offers substantial savings in device resources when compared to prior multi-channel NCO configurations, such as the one shown in FIG. 3B. In this case, the embodiment of the present invention shown in FIG. 5 obviates the need for 7 additional sets of NCO lines, including individual phase accumulators and sine/cosine generation units.

Generally, embodiments of the present invention employ various processes involving data stored in or transferred through one or more computer systems. Embodiments of the present invention also relate to a hardware device or other apparatus for performing these operations. This apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will be apparent to those of ordinary skill in the art based on the description given below.

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, bitstreams, data signals, values, elements, variables, characters, data structures, or the like. It should be remembered, however, that all of these and similar terms are to be associated with the appropriate physical quantities and are merely convenient labels applied to these quantities.

Further, the manipulations performed are often referred to in terms such as identifying, fitting, or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operating a computer and the method of computation itself. Embodiments of the present invention relate to method steps for operating a computer in processing electrical or other physical signals to generate other desired physical signals.

Embodiments of the present invention also relate to an apparatus such as hardware for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 6:
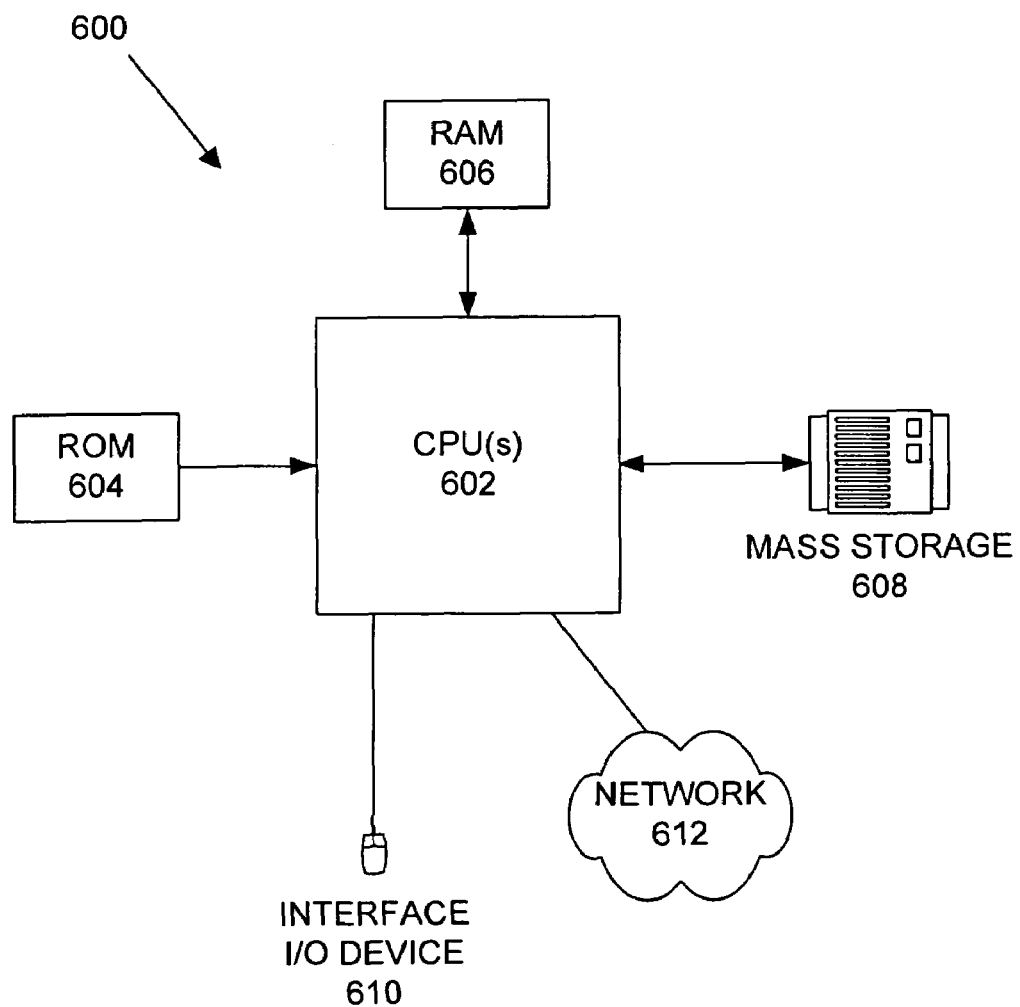
FIG. 6 is a block diagram of a typical computer system suitable for implementing an embodiment of the present invention.

FIG. 6 illustrates a typical computer system that can be used by a user and/or controller in accordance with one or more embodiments of the present invention. The computer system 600 includes any number of processors 602 (also referred to as central processing units, or CPUs) that are coupled to storage devices including primary storage 606 (typically a random access memory, or RAM) and another primary storage 604 (typically a read only memory, or ROM). As is well known in the art, primary storage 604 acts to transfer data and instructions uni-directionally to the CPU and primary storage 606 is used typically to transfer data and instructions in a bi-directional manner. Both of these primary storage devices may include any suitable computer-readable media described above. A mass storage device 608 also is coupled bi-directionally to CPU 602 and provides additional data storage capacity and may include any of the computer-readable media described above. The mass storage device 608 may be used to store programs, data and the like and is typically a secondary storage medium such as a hard disk that is slower than primary storage. It will be appreciated that the information retained within the mass storage device 608, may, in appropriate cases, be incorporated in standard fashion as part of primary storage 606 as virtual memory. A specific mass storage device such as a CD-ROM may also pass data uni-directionally to the CPU.

CPU 602 also is coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 602 optionally may be coupled to a computer or telecommunications network using a network connection as shown generally at 612. With such a network connection, it is contemplated that the CPU might receive information from the network, or might output information to the network in the course of performing the above-described method steps. The above-described devices and materials will be familiar to those of skill in the computer hardware and software arts.

The hardware elements described above may define multiple software modules for performing the operations of this invention. For example, instructions for creating and/or implementing a multi-channel CIC interpolator, a multi-channel CIC decimator and/or multi-channel NCO may be stored on mass storage device 608 or 604 and executed on CPU 602 in conjunction with primary memory 606. In synthesizing a design that includes one or more embodiments of the present invention from a simulation version or other file, a user may use a compiler to generate the design for implementation in hardware. It should be understood that other compiler designs may be employed with this invention. For example, some compilers will include a partitioning module to partition a technology mapped design onto multiple hardware entities. In addition, the compiler may be adapted to handle hierarchical designs, whereby synthesis, mapping, etc. are performed recursively as the compiler moves down branches of a hierarchy tree. Additional details of compiler software for PLDs may be found in U.S. Pat. No. 6,080,204, issued Jun. 27, 2000, naming Mendel as inventor, and entitled "METHOD AND APPARATUS FOR CONTEMPORANEOUSLY COMPILING AN ELECTRONIC CIRCUIT DESIGN BY CONTEMPORANEOUSLY BIPARTITIONING THE ELECTRONIC CIRCUIT DESIGN USING PARALLEL PROCESSING."

Figure 7:
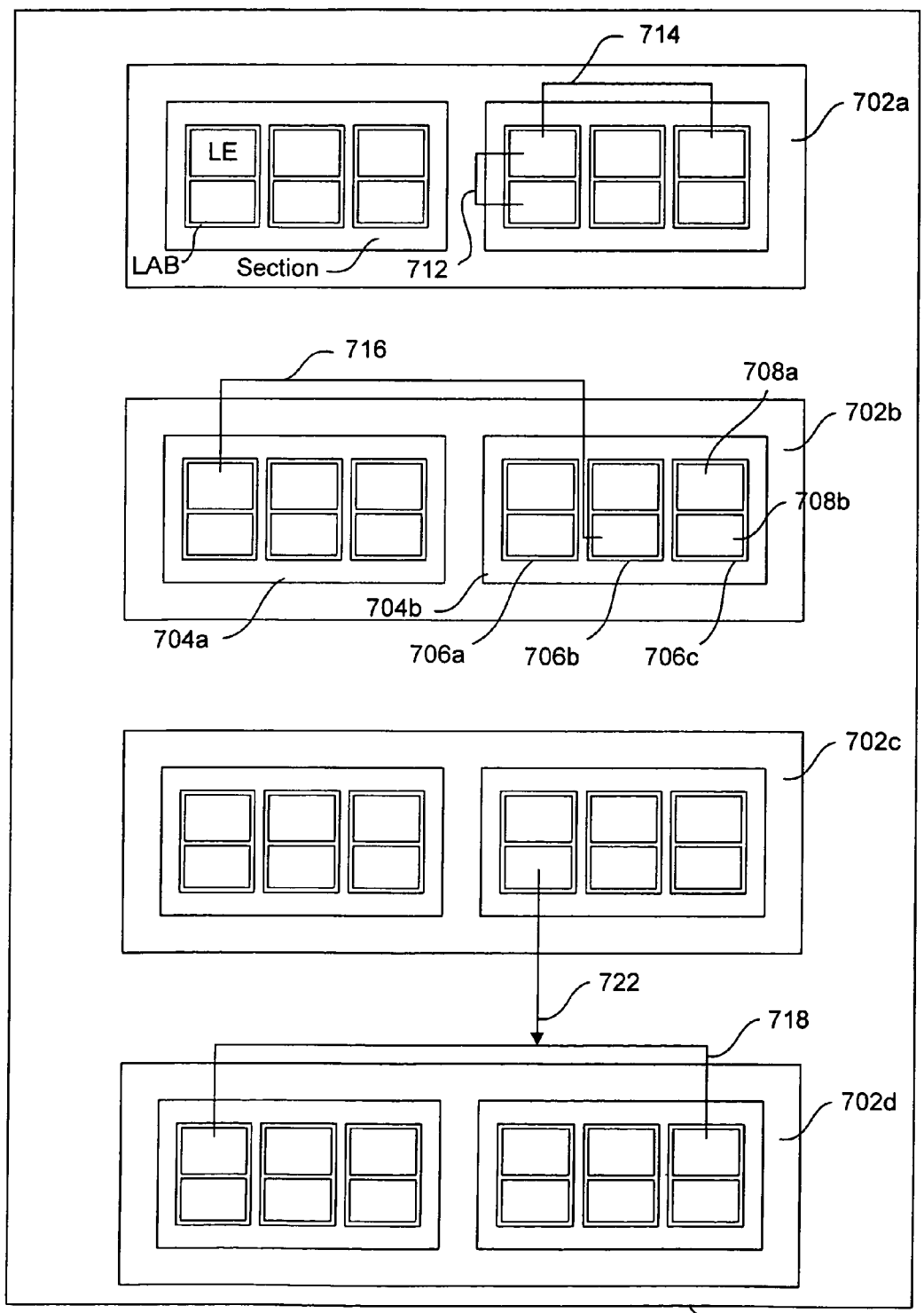
FIG. 7 is an idealized block representation of the architecture of an arbitrary hardware device, including interconnects, which may be employed in fitting gates from a synthesized sub-netlist generated in accordance with this invention.

The form of a compiled design may be further understood with reference to a hypothetical target hardware device having multiple hierarchical levels. Such a hardware device is represented in FIG. 7. This idealized representation roughly conforms to the layout of a FLEX 10K programmable logic device available from Altera Corporation of San Jose, Calif. In FIG. 7, a programmable logic device 700 is segmented into a plurality of "rows" to facilitate interconnection between logic elements on a given row. In the hypothetical example shown, there are four rows: 702a, 702b, 702c, and 702d.

Each row of programmable logic device 700 is further subdivided into two "half-rows." For example, row 702b is shown to contain a half-row 704a and a half-row 704b. The next lower level of the hierarchy is the "logic array block" (LAB). Half-row 704b, for example, contains three LABs: an LAB 706a, an LAB 706b, and an LAB 706c. Finally, at the base of the of the hierarchy are several logic elements. Each such logic element exists within a single logic array block. For example, LAB 706c includes two logic elements: a logic element 708a and a logic element 708b.

In short, PLD 700 includes four hierarchical levels: (1) rows, (2) half-rows, (3) LABs, and (4) logic elements (LEs). Any logic element within PLD 700 can be uniquely specified (and located) by specifying a value for each of these four levels of the containment hierarchy. For example, logic element 708b can be specified as follows: row (2), half-row (2), LAB (3), LE (2). To fit a logic design onto a target hardware device such as that shown in FIG. 7, a synthesized netlist is divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 700 includes multiple levels of routing lines (interconnects). These connect the uniquely placed logic cells to complete circuits. In PLD 700, for example, four levels of interconnect are provided, one for each of the four hierarchy levels. First a local interconnect such as interconnect 712 is employed to connect two logic elements within the same LAB. At the next level, a LAB-to-LAB interconnect such as interconnect 714 is employed to connect two LABs within the same half-row. At the next higher level, a "global horizontal" interconnect is employed to connect logic elements lying in the same row but in different half-rows. An example of a global horizontal interconnect is interconnect 716 shown in row 702b. Another global horizontal interconnect is shown as interconnect 718, linking logic elements within row 702d. Finally, a "global vertical" interconnect is employed to link a logic element in one row with a logic element in a different row. For example, a global vertical interconnect 722 connects a logic element in the first LAB of the second half-row of row 702c to two separate logic elements in row 702d. In the embodiment shown, this is accomplished by providing global vertical interconnect 702 between the above-described logic element in row 702c to global horizontal interconnect 718 in row 702d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths must be evaluated to determine which is best for the design being fit. The interconnect structure and overall architecture of the Altera FLEX 10K family of PLDs is described in much greater detail in U.S. Pat. No. 5,550,782, issued Aug. 27, 1996, naming Cliff et al. as inventors, and entitled "PROGRAMMABLE LOGIC ARRAY INTEGRATED CIRCUITS." That patent is incorporated herein by reference for all purposes. Additional discussion of the FLEX 10K and other PLD products may be found in other publications from Altera Corporation of San Jose, Calif.

Briefly, in the FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ASICs that can benefit from application of the present invention.

Figure 8:
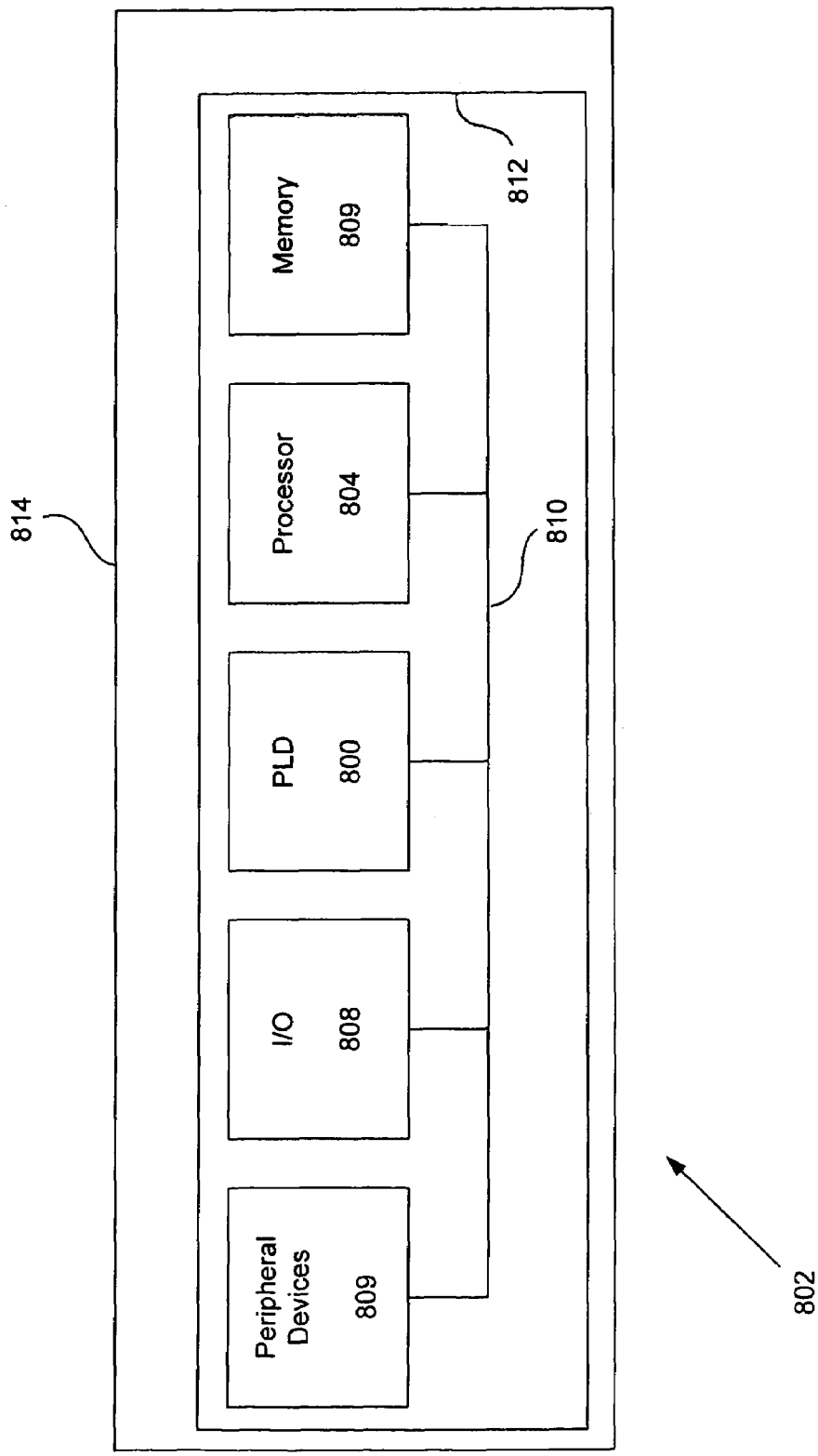
FIG. 8 is a block diagram depicting a system containing a PLD in accordance with this invention.

This invention also relates to programmable logic devices programmed with a design prepared in accordance with the above described structures, devices and methods. The invention further relates to systems employing such programmable logic devices. FIG. 8 illustrates a PLD 800 of the present invention in a data processing system 802. The data processing system 802 may include one or more of the following components: a processor 804; memory 806; I/O circuitry 808; and peripheral devices 809. These components are coupled together by a system bus 810 and are populated on a circuit board 812 which is contained in an end-user system 814.

The system 802 can be used in a wide variety of applications, such as computer networking, data networking, instrumentation, video processing, digital signal processing, or any other application where the advantage of using reprogrammable logic is desirable. The PLD 800 can be used to perform a variety of different logic functions.

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation illustrated and described. Therefore, the described embodiments are illustrative and not restrictive, and the invention should not be limited to the details given herein but should be defined by the following claims and their full scope of equivalents, whether foreseeable or unforeseeable now or in the future.

What is claimed is:

1. A multi-channel integrator comprising:
an integrator input;
an integrator output;
an adder comprising:
    a first adder input connected to the integrator input;
    a second adder input; and
    an adder output;
a delay section comprising:
    a delay section input that receives data of a plurality of channels;
    a delay section output; and
    a plurality of delay elements connected in series between the delay section input and the delay section output, each delay element of the plurality of delay elements delaying the data of each of the plurality of channels and providing an output that is specific to an individual channel of the plurality of channels; and
a feedback line connecting the delay section output to the second adder input;
wherein the adder output is connected to the delay section input; and
further wherein the delay section output is connected to the integrator output.

2. A multi-channel numerically controlled oscillator comprising the integrator of claim 1.

3. The multi-channel numerically controlled oscillator of claim 2 further comprising:
a phase incrementer input multiplexer connected to the integrator input; and
a sine/cosine generation unit connected to the integrator output.

4. The multi-channel numerically controlled oscillator of claim 2 wherein the numerically controlled oscillator is an M channel numerically controlled oscillator and further wherein the delay section of the integrator comprises at least M delay elements in series.

5. An M channel decimator, wherein M>1, the decimator comprising:
the integrator of claim 1.

6. The M channel decimator of claim 5 further comprising:
a down-sampler having a down-sampler input connected to the integrator output and a down-sampler output;
a differentiator connected to the down-sampler output; and
a multiplexer that multiplexes M channels and provides a multiplexed signal to the integrator.

7. An N stage multi-channel decimator wherein the decimator comprises an integrator section comprising at least N instances of the integrator of claim 1 in series.

8. The N stage multi-channel decimator of claim 7 wherein the decimator is an M channel decimator and further wherein the plurality of delay elements in each integrator comprises at least M delay elements.

9. An M channel interpolator, wherein M>1, the interpolator comprising:
the integrator of claim 1 wherein the plurality of delay elements comprises at least M delay elements.

10. The M channel interpolator of claim 9 further comprising:
an up-sampler having an up-sampler output connected to the integrator input and an up-sampler input; and
a differentiator connected to the up-sampler input.

11. An N stage multi-channel interpolator wherein the interpolator comprises an integrator section comprising at least N instances of the integrator of claim 1 in series.

12. The N stage multi-channel interpolator of claim 11 wherein the interpolator is an M channel interpolator and further wherein each integrator in the integrator section comprises the integrator of claim 1 and further wherein the plurality of delay elements comprises at least M delay elements.

13. The integrator of claim 1 wherein the integrator is implemented in a programmable device.

14. The integrator of claim 1 wherein the delay section is implemented in one or more embedded memory blocks in a programmable device.

15. A multi-channel differentiator comprising:
a differentiator input;
a differentiator output:
a subtractor comprising:
a first subtractor input;
a second subtractor input; and
a subtractor output;
a delay section comprising:
a delay section input connected to the differentiator input, the delay section input receiving data of a plurality of channels;
a delay section output; and
a plurality of delay elements connected in series between the delay section input and the delay section output, each delay element of the plurality of delay elements delaying the data of each of the plurality of channels and providing an output that is specific to an individual channel of the plurality of channels; and
a feedforward line connecting the differentiator input to the first subtractor input;
wherein the delay section output is connected to the second subtractor input; and
wherein the subtractor output is connected to the differentiator output.

16. An M channel decimator, wherein M>1, the decimator comprising:
the differentiator of claim 15 wherein the plurality of delay elements comprises at least M delay elements.

17. The M channel decimator of claim 16 further comprising:
a down-sampler having a down-sampler output connected to the differentiator input and a down-sampler input; and
an integrator connected to the down-sampler input.

18. An N stage multi-channel decimator wherein the decimator comprises a differentiator section comprising at least N instances of the differentiator of claim 15 in series.

19. The N stage multi-channel decimator of claim 18 wherein the decimator is an M channel decimator and further wherein the plurality of delay elements in each differentiator comprises at least M delay elements.

20. An M channel interpolator, wherein M>1, the interpolator comprising:
the differentiator of claim 15 wherein the plurality of delay elements comprises at least M delay elements.

21. The M channel interpolator of claim 20 further comprising:
an up-sampler having an up-sampler input connected to the differentiator output and an up-sampler output; and
an integrator connected to the up-sampler output.

22. An N stage multi-channel interpolator wherein the interpolator comprises a differentiator section comprising at least N instances of the differentiator of claim 15 in series.

23. The N stage multi-channel interpolator of claim 22 wherein the interpolator is an M channel interpolator and further wherein the plurality of delay elements in each differentiator comprises at least M delay elements.

24. The differentiator of claim 15 wherein the integrator is implemented in a programmable device.

25. The differentiator of claim 15 wherein the delay section is implemented in one or more embedded memory blocks in a programmable device.

26. An N stage, M channel decimator, where M>1, the decimator comprising:
an integrator section comprising:
an integrator section input comprising a multiplexer comprising M multiplexer inputs and a multiplexer output;
an integrator section output; and
N integrators connected in series between the integrator section input and the integrator output, wherein each integrator comprises:
an integrator input;
an integrator output;
an adder comprising:
a first adder input connected to the integrator input;
a second adder input; and
an adder output;
a delay section comprising:
a delay section input;
a delay section output; and M delay elements connected in series between the delay section input and the delay section output, each of the M delay elements delaying data of each of the M multiplexer inputs and providing an output that is specific to an individual channel of the M channels; and
a feedback line connecting the delay section output to the second adder input;
wherein the adder output is connected to the delay section input; and
further wherein the delay section output is connected to the integrator output;
a differentiator section comprising:
a differentiator section input;
a differentiator output; and N differentiators connected in series between the differentiator input and the differentiator output, wherein each differentiator comprises:
a differentiator input;
a differentiator output:
a subtractor comprising:
a first subtractor input;
a second subtractor input; and
a subtractor output;
a delay section comprising:
a delay section input connected to the differentiator input;
a delay section output; and
M delay elements connected in series between the delay section input and the delay section output; and
a feedforward line connecting the differentiator input to the first subtractor input;
wherein the delay section output is connected to the second subtractor input; and
wherein the subtractor output is connected to the differentiator output; and
a down-sampler comprising a down-sampler input connected to the integrator section output and a down-sampler output connected to the differentiator section input.

27. An N stage, M channel interpolator, where M>1, the interpolator comprising:
a differentiator section comprising:
a differentiator section input comprising a multiplexer comprising M multiplexer inputs and a multiplexer output;
a differentiator output; and
N differentiators connected in series between the differentiator input and the differentiator output, wherein each differentiator comprises:
a differentiator input;
a differentiator output:
a subtractor comprising:
a first subtractor input;
a second subtractor input; and
a subtractor output;
a delay section comprising:
a delay section input connected to the differentiator input;
a delay section output; and
M delay elements connected in series between the delay section input and the delay section output, each of the M delay elements delaying data of each of the M multiplexer inputs and providing an output that is specific to an individual channel of the M channels; and
a feedforward line connecting the differentiator input to the first subtractor input;
wherein the delay section output is connected to the second subtractor input; and
wherein the subtractor output is connected to the differentiator output;
an integrator section comprising:
an integrator section input;
an integrator section output; and
N integrators connected in series between the integrator section input and the integrator output, wherein each integrator comprises:
an integrator input;
an integrator output;
an adder comprising:
a first adder input connected to the integrator input;
a second adder input; and
an adder output;
a delay section comprising:
a delay section input;
a delay section output; and
M delay elements connected in series between the delay section input and the delay section output; and
a feedback line connecting the delay section output to the second adder input;
wherein the adder output is connected to the delay section input; and
further wherein the delay section output is connected to the integrator output; and
an up-sampler comprising an up-sampler input connected to the differentiator section output and an up-sampler output connected to the integrator section input.

28. An M channel numerically controlled oscillator, where M>1, the numerically controlled oscillator comprising:
an oscillator input comprising a multiplexer comprising M multiplexer inputs and a multiplexer output;
a sine/cosine generator having a generator input; and
an integrator comprising:
an integrator input connected to the multiplexer output;
an integrator output connected to the generator input;
an adder comprising:
a first adder input connected to the integrator input;
a second adder input; and
an adder output;
a delay section comprising:
a delay section input;
a delay section output; and
M delay elements connected in series between the delay section input and the delay section output, each of the M delay elements delaying data of each of the M multiplexer inputs and providing an output that is specific to an individual channel of the M channels; and
a feedback line connecting the delay section output to the second adder input;
wherein the adder output is connected to the delay section input; and
further wherein the delay section output is connected to the integrator output.

29. A computer program product for performing multi-channel integration on data of a plurality of channels, the computer program product stored on a computer storage media having computer readable code embodied therein, the computer readable code comprising:
computer code that, when executed by a processor, programs a device to create a programmed device, wherein the programmed device comprises:
a multi-channel integrator comprising:
an integrator input;
an integrator output;
an adder comprising:
a first adder input connected to the integrator input;
a second adder input; and
an adder output;
a delay section comprising:
a delay section input;
a delay section output; and
a plurality of delay elements connected in series between the delay section input and the delay section output, each delay element of the plurality of delay elements delaying the data of each of the plurality of channels and providing an output that is specific to an individual channel of the plurality of channels; and a feedback line connecting the delay section output to the second adder input;

wherein the adder output is connected to the delay section input; and furrther wherein the delay section output is connected to the integrator output.

30. A computer program product for performing multi-channel differentiation on data of a plurality of channels, the computer program product stored on a computer storage media having computer readable code embodied therein, the computer readable code comprising:

computer code that, when executed by a processor, programs a device to create a programmed device, wherein the programmed device comprises:

a multi-channel differentiator comprising multi-channel differentiator comprising:

a differentiator input;

a differentiator output:

a subtractor comprising:
  a first subtractor input;
  a second subtractor input; and
  a subtractor output;
a delay section comprising:
  a delay section input connected to the differentiator input;
  a delay section output; and
  a plurality of delay elements connected in series between the delay section input and the delay section output, each delay element of the plurality of delay elements delaying the data of each of the plurality of channels and providing an output that is specific to an individual channel of the plurality of channels; and
a feedforward line connecting the differentiator input to the first subtractor input;
wherein the delay section output is connected to the second subtractor input; and
wherein the subtractor output is connected to the differentiator output.

* * * * *

UNITED STATES PATENT AND TRADEMARK OFFICE
CERTIFICATE OF CORRECTION

PATENT NO.      : 7,613,760 B1                                           Page 1 of 1
APPLICATION NO. : 10/804294
DATED           : November 3, 2009
INVENTOR(S)     : Esposito et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1573 days.

Signed and Sealed this

Nineteenth Day of October, 2010

David J. Kappos
*Director of the United States Patent and Trademark Office*